(12) United States Patent
Ndip et al.

(10) Patent No.: US 11,394,109 B2
(45) Date of Patent: Jul. 19, 2022

(54) MODULE ARRANGEMENT COMPRISING EMBEDDED COMPONENTS AND AN INTEGRATED ANTENNA, DEVICE COMPRISING MODULE ARRANGEMENTS, AND METHOD FOR MANUFACTURING

(71) Applicant: Fraunhofer-Gesellschaft zur Foerderung der angewandten Forschung e.V., Munich (DE)

(72) Inventors: Ivan Ndip, Berlin (DE); Andreas Ostmann, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/861,769

(22) Filed: Jan. 4, 2018

(65) Prior Publication Data

US 2018/0191062 A1 Jul. 5, 2018

(30) Foreign Application Priority Data

Jan. 5, 2017 (DE) .................. 102017200127.5

(51) Int. Cl.
*H01Q 1/52* (2006.01)
*H01Q 1/38* (2006.01)
(Continued)

(52) U.S. Cl.
CPC ................ *H01Q 1/38* (2013.01); *H01Q 1/02* (2013.01); *H01Q 1/2283* (2013.01); *H01Q 1/40* (2013.01); *H01Q 15/006* (2013.01); *H01Q 15/02* (2013.01)

(58) Field of Classification Search
CPC .. H01Q 1/38; H01Q 1/40; H01Q 1/02; H01Q 1/2283; H01Q 15/006; H01Q 15/02
See application file for complete search history.

(56) References Cited

U.S. PATENT DOCUMENTS 5,386,215 A 1/1995 Brown
6,329,949 B1 * 12/2001 Barnett .................. H01Q 1/246
333/202
(Continued)

FOREIGN PATENT DOCUMENTS

DE 19954941 A1 6/2001
DE 69430765 T2 1/2003
(Continued)

OTHER PUBLICATIONS

Kunud Ranjan Jha, Analysis and design of terahertz microstrip antenna on photonic bandgap material, Aug. 2012, pp. 364-373 (Year: 2012).*
(Continued)

*Primary Examiner* — Dieu Hien T Duong
(74) *Attorney, Agent, or Firm* — Perkins Coie LLP; Michael A. Glenn

(57) ABSTRACT

What is disclosed is a module arrangement having an antenna layer, a shielding layer, a distribution layer and a component layer. The antenna layer supports an integrated antenna device. The shielding layer has a shielding effect relative to electromagnetic signals. The distribution layer has structures for distributing signals and/or electrical energy. Finally, the component layer supports embedded electronic components. In addition, a device comprising module arrangements and a method for manufacturing a module arrangement are disclosed.

26 Claims, 13 Drawing Sheets

(51) Int. Cl.
  *H01Q 1/02*   (2006.01)
  *H01Q 1/40*   (2006.01)
  *H01Q 1/22*   (2006.01)
  *H01Q 15/00*  (2006.01)
  *H01Q 15/02*  (2006.01)

(56)      References Cited

U.S. PATENT DOCUMENTS

| | | | |
|---|---|---|---|
| 7,522,105 B1* | 4/2009 | LaComb | H01Q 1/28 |
| | | | 343/700 MS |
| 7,522,205 B2 | 4/2009 | Parks | |
| 8,411,444 B2 | 4/2013 | Gaynes et al. | |
| 2005/0073460 A1 | 4/2005 | Schmidt et al. | |
| 2006/0049995 A1* | 3/2006 | Imaoka | H01Q 1/2283 |
| | | | 343/702 |
| 2007/0026567 A1* | 2/2007 | Beer | G01S 7/032 |
| | | | 438/106 |
| 2008/0029886 A1 | 2/2008 | Cotte et al. | |
| 2008/0186247 A1 | 8/2008 | Cotte et al. | |
| 2009/0041994 A1 | 2/2009 | Ockenfuss et al. | |
| 2009/0168367 A1 | 7/2009 | Fujii | |
| 2011/0018114 A1* | 1/2011 | Pagaila | H01L 21/568 |
| | | | 257/686 |
| 2012/0182066 A1 | 7/2012 | Merkle et al. | |
| 2013/0194754 A1* | 8/2013 | Jung | H01L 23/5385 |
| | | | 361/720 |
| 2014/0110840 A1 | 4/2014 | Wojnowski et al. | |
| 2015/0325925 A1 | 11/2015 | Kamgaing et al. | |
| 2017/0181287 A1 | 6/2017 | Jhang et al. | |
| 2017/0236776 A1* | 8/2017 | Huynh | H01Q 21/061 |
| | | | 257/428 |
| 2018/0332151 A1 | 11/2018 | Kamgaing et al. | |
| 2019/0081013 A1* | 3/2019 | Chen | H01L 23/58 |
| 2019/0305429 A1 | 10/2019 | Ying et al. | |

FOREIGN PATENT DOCUMENTS

| | | |
|---|---|---|
| DE | 19954941 C2 | 6/2003 |
| DE | 102005032489 B3 | 11/2006 |
| DE | 102006023123 A1 | 1/2007 |
| DE | 102013111569 A1 | 4/2014 |
| EP | 0611129 B1 | 6/2002 |
| JP | 2004096259 A * | 3/2004 |
| JP | 2007129304 A * | 5/2007 |
| WO | 0137338 A2 | 5/2001 |

OTHER PUBLICATIONS

Yole Report, "Fan-out and Embedded Die: Technologies & Market Trends", "Fan-out and Embedded Die—Technologies and Market Trends", YOLE Report, Mar. 2015, 1-29.

* cited by examiner

MODULE ARRANGEMENT COMPRISING EMBEDDED COMPONENTS AND AN INTEGRATED ANTENNA, DEVICE COMPRISING MODULE ARRANGEMENTS, AND METHOD FOR MANUFACTURING

CROSS-REFERENCE TO RELATED APPLICATION

This application claims priority from German Application No. 10 2017 200 127.5, which was filed on Jan. 5, 2017, which is incorporated herein in its entirety by this reference thereto.

BACKGROUND OF THE INVENTION

The invention relates to a module arrangement comprising embedded components and an integrated antenna, to a device comprising module arrangements, and to a method for manufacturing a module arrangement.

Module arrangements on which electronic components are applied are known and used in many fields of technology. Relevant and critical fields and topics in such module arrangements are the electric connection between the components, contacting components from outside or reducing the space requirements of the components, for example, and, consequently, decreasing the arrangement in size. Frequently, the goal is increasing the integration density.

Printed circuit boards (also referred to as PCBs) are potential components of the module arrangements and generally are made of an electrically insulating material and comprise conductive connections in the form of conductive tracks on their (top and bottom) sides.

Thus, arrangements comprising a printed circuit board or several printed circuit boards arranged one above the other (so-called multi-layer printed circuit boards) are known. So-called prepregs are sometimes used for manufacturing the printed circuit boards. These are semi-finished textile fiber matrix products pre-impregnated with resins which are cured under the influence of pressure and temperature.

It is known in conventional technology to embed components or chips in the printed circuit boards, for example. Two basic methods are differentiated between, which differ in the fact whether the contacts or pins of the components are facing the printed circuit board (so-called face-down embedding) or facing away from the printed circuit board (so-called face-up embedding). Thus, particularly, the components are embedded in the material of the printed circuit board (see, for example, DE 199 54 941 A1, DE 10 2005 032 489 B3 or DE 694 30 765 T2).

SUMMARY

An embodiment may have a module arrangement, wherein the module arrangement has at least an antenna layer, a shielding layer, a distribution layer and a component layer, wherein the antenna layer supports an integrated antenna device, wherein the shielding layer is implemented so as to be of a shielding effect relative to electromagnetic signals, wherein the distribution layer has structures for distributing signals and/or electrical energy, and wherein the component layer supports embedded electronic components.

Another embodiment may have a device having module arrangements, wherein the module arrangements are implemented as mentioned above.

Another embodiment may have a method for manufacturing a module arrangement, wherein an antenna layer having an integrated antenna device is produced, wherein a shielding layer is produced, wherein a distribution layer is produced, wherein a component layer having embedded components is produced, and wherein at least the antenna layer, the shielding layer, the distribution layer and the component layer are connected to one another and/or are at least partly produced together.

Thus, the module arrangement comprises at least an antenna layer, a shielding layer, a distribution layer and a component layer. The antenna layer supports an integrated antenna device. The shielding layer is implemented so as to be of a shielding effect relative to electromagnetic signals. The distribution layer comprises structures for distributing signals and/or electrical energy. The component layer supports embedded electronic components.

The antenna device is integrated in the antenna layer and the electronic components are embedded in the component layer.

In implementations, the module arrangement comprises further layers which are not described here. Exemplarily, in one implementation, further layers also support electronic components. Alternatively or additionally, depending on the implementation, the layers mentioned above (as antenna, shielding, distribution and/or component layer) are made up of several individual layers.

In one implementation, at least one of the layers mentioned before is a printed circuit board layer.

In one implementation, the antenna layer is located on the top side of the module arrangement. Thus, in another implementation, the antenna device, at least with the active portion for emitting the electromagnetic signals, is located on the top side of the antenna layer.

In one implementation, at least one structure for focusing the radiation of the antenna device is provided—advantageously above the antenna layer. In another implementation, at least one structure for focusing the radiation of the antenna device is located above the antenna layer. In one embodiment, the structure is a lens.

In one implementation, at least the antenna layer and the component layer each are printed circuit boards.

One implementation of the module arrangement is that, starting from a top side towards the bottom side of the module arrangement, the following sequence is provided: antenna layer, shielding layer, distribution layer and component layer. The shielding layer in particular protects the electronic components of the component layer relative to the electromagnetic signals of the antenna device and/or, in particular, relative to stray fields. Conversely, the shielding layer protects the antenna device from influences of the components, like the chips of the component layer, for example. In one implementation, the shielding layer comprises a metal layer.

The distribution layer following after the shielding layer comprises the structures, like lines, contacts, via holes, etc., in order for the antenna device to be connected to the components of the component layer. Additionally, contacting of the components among one another is realized via the distribution layer. The distribution layer thus allows contacting the components of the module arrangement among one another and, above all, within the module arrangement itself. This means that, in one implementation, there is no contacting guided to the outside. In one implementation, the electronic components are chips, integrated circuits or passive elements, like inductances, capacitors, electrical resistors, filters, switches or directional couplers.

In one implementation, metallizations are applied on the top side of the module arrangement and, thus, also on the top side of the antenna layer.

The module arrangement here may particularly be referred to as an electronic module.

In one implementation, the antenna device comprises an element or, in another implementation, is made up of several elements which are summed up to form an array.

The antenna device in one implementation is provided with a vertical feed, so-called "proximity feed", so-called "aperture coupled feed" or planar feeds. Depending on the type of driving, one implementation provides for at least one metal layer to be provided below the antenna layer for driving.

Depending on the implementation, the antenna device exemplarily comprises at least one patch antenna, a grid array antenna or a slot antenna. Alternatively, it comprises at least one antenna having a waveguide which is formed at least partly by the antenna layer. In other implementations, dipole, monopole, Yagi-Uda or Vivaldi antennas may be provided, for example. In alternative or additional implementations, reconfigurable and/or small antennas (so-called "electrically small antennas", which are very small relative to their radian sphere pursuant to the definition by H. A. Wheeler) may be provided. Different antenna configurations are provided for in alternative or complementary implementations.

In case the antenna device is a reconfigurable antenna, in one implementation, the respective components, like switches or diodes, are part of the antenna layer and, in an alternative implementation, are arranged in a layer below the antenna layer—like in the component layer, for example.

In one implementation, the antenna layer is free from electronic components so that the entire upper half is covered by one or several antenna rays.

At least one of the layers of the module arrangement exemplarily is made of a polymer, laminate suitable for high frequencies, glass or dielectric.

In one implementation, at least one metal core (alternative term: metal layer) is provided, wherein the metal core is located below the component layer. The term "below" in particular relates to the sequence of layers described so that the antenna layer is located above the component layer.

One implementation of the module arrangement includes the contacts for electrically contacting the module arrangement to be located on the bottom side. In one implementation, the contacts (like Ball Grid Arrays) for electrical contacting are located only on the bottom side of the module arrangement. Thus, the antenna device is located on the top side and contacting or connection of the module arrangement to other components, elements, devices, etc. is realized on the bottom side.

One implementation of the module arrangement is for only the component layer to support electronic components. In this implementation, all the electronic components are summed up and bundled in the component layer. This makes manufacturing the module arrangement particularly easy.

In the module arrangement, the electronic components are embedded (or integrated) in the component layer. Contacts of at least some components in one implementation are facing in a direction towards the top side of the module arrangement and are partly guided to the bottom side by corresponding connective elements or connective structures for contacting to the outside.

In one implementation, at least one electronic component is produced directly in the component layer. This is quite the opposite to separate electronic components which are connected to the component layer or embedded in the same. The electronic components produced in the component layer exemplarily are implemented to be capacitors which may be located close to the active components, like chips, for example. The energy distribution can be stabilized in this way. Alternatively or additionally, inductances are provided as electronic components.

The distribution layer is particularly implemented for transferring electrical energy and/or signals between components and/or between components and the antenna device. Further transfer structures are located—depending on the implementation—also in the other layers in order to reach the respective components and the antenna device. These may, for example, be via holes. In one implementation, the distance between the antenna device and further components, like chips, or between components among one another is kept as small as possible. This serves for influencing signals as little as possible.

One implementation of the module arrangement is for the module arrangement to comprise a temperature control layer. The temperature control layer serves for dissipating or distributing heat which is produced by the electronic components, for example. In one implementation, a temperature control layer is made of a thermally well conducting material. The material of the temperature control layer in one implementation is, in particular, a dielectric.

An implementation of the module arrangement provides for the temperature control layer, starting from a top side towards a bottom side of the module arrangement, to follow the component layer. In this implementation, the temperature control layer is located below the component layer and, in one implementation, thus also is the bottom most layer of the module arrangement. Thus, in one implementation, the contacts for contacting the module arrangement just mentioned are guided from the outside through the temperature control layer to the bottom side of the module arrangement.

In one implementation, at least one cooling component is provided. It particularly serves for dissipating heat of the electronic components. In one implementation, this may be a "heat sink", for example.

In one implementation, it is provided for at least one embedded electronic component to be thermally connected to a cooling body—advantageously directly or, in one implementation, via a thermally conductive adhesive—and/or for at least one embedded electronic component to be thermally connected to a cooling body via a metal core, and/or for at least one embedded electronic component to be thermally connected to a cooling body via at least one via hole (different term: thermal via), and/or for at least one embedded electronic component to be thermally connected to a cooling body via a metal core and via at least one via hole. The cooling body is a "heat sink", for example.

One implementation of the module arrangement is for at least one electronic component to be connected to at least one cooling component. In one implementation, heat-conducting elements which are thermally coupled to the component and dissipate heat and/or guide heat to the cooling components are provided in the module arrangement.

One implementation of the module arrangement provides for the antenna layer to comprise holes. In one implementation, the holes form a photonic bandgap structure which filters surface waves. Alternatively or additionally, the holes reduce the permittivity of the antenna layer. The implementations allow using larger dimensioned antenna structures in the millimeter wave or terahertz ranges. The larger dimensions also reduce the impacts of manufacturing tolerances.

Alternatively or additionally, electromagnetic bandgap structures are provided in the module arrangement.

One implementation of the module arrangement is for the antenna device to comprise a continuous surface.

One implementation of the module arrangement is for the antenna device to comprise an interrupted surface.

One implementation of the module arrangement is for the antenna device to be configured such that electromagnetic signals are emitted in a direction perpendicular to the top side of the module arrangement away from the top side. In this implementation, the antenna device emits electromagnetic signals in a vertical plane which is perpendicular to the plane of the antenna device.

One implementation of the module arrangement provides for the antenna device to be configured such that electromagnetic signals are emitted in a direction which is located within a plane of the top side of the module arrangement. In this implementation, the antenna device emits electromagnetic signals in an azimuthal direction, that is laterally particularly relative to the module arrangement.

In another implementation, the antenna device emits the signals in a vertical and azimuthal direction.

In one implementation, the antenna device is configured for transmitting and for receiving electromagnetic signals.

One implementation of the module arrangement is for the shielding layer to comprise at least two sublayers. Thus, in one implementation, a recess is located between the two sublayers. In one implementation, spacers are located between the two sublayers. In one implementation, the sublayers are separated from each other by an air layer. Contactings of the antenna device here are guided over the recess. In an alternative implementation, bonding elements are located between the sublayers so that the result is the strongest possible connection between the sublayers.

One implementation of the module arrangement provides for the temperature control layer to comprise thermal via holes. These thermal vias serve for dissipating heat.

In one implementation of the module arrangement, it is provided for at least one electronic component to be embedded in the module arrangement, for at least one antenna device to be integrated in the module arrangement and for at least one cooling component for removing thermal energy to be present.

In one implementation of the module arrangement, it is provided for the manufacturing method of the antenna layer and/or the material of the antenna layer to be different from the manufacturing method of other layers and the materials of other layers. In this implementation, the manufacturing method of the antenna layer or the other layers or the remaining layers of the module arrangement differ among one another. Alternatively or additionally, there may be differences in material.

In one implementation, holes are provided in the antenna layer. The layers here are implemented and arranged such that the result is a photonic bandgap structure for filtering surface waves. Alternatively or additionally, the permittivity of the antenna layer is reduced by the holes.

In addition, the object of the invention is achieved by a device comprising module arrangements, wherein the module arrangements are implemented in accordance with any of the implementations mentioned before.

The device comprises several module arrangements which each comprise an antenna device and, in one implementation, particularly are driven such that together they generate a desired radiation characteristic.

An implementation of the device is for the module arrangements to be arranged in a matrix. In this implementation, the module arrangements or, in particular, the antenna devices thereof form a so-called array. In one implementation, an n*n arrangement is provided so that n antenna devices are provided in each of n rows.

The above implementations of the module arrangement may correspondingly be transferred to the device so that a repetition is omitted here.

Additionally, the object of the invention is achieved by a method for manufacturing a module arrangement.

The method comprises at least the following steps:
an antenna layer comprising an integrated antenna device is produced,
a shielding layer is produced,
a distribution layer is produced,
a component layer comprising embedded components is produced, and
at least the antenna layer, the shielding layer, the distribution layer and the component layer are connected to one another and/or at least partly produced together.

In another implementation, a metal core (alternative term: metal layer) may be produced below at least one embedded component.

In another implementation, a structure for focusing the antenna radiation is produced.

In another implementation, at least one cooling body is applied.

In another implementation, at least one structure for focusing the radiation of the antenna device is produced. The structure may, for example, be a lens.

The individual layers in one implementation are produced separately and connected to one another afterwards. In an alternative implementation, at least two layers are produced together. In one implementation, at least one layer is produced separately from the other layers.

In one implementation, the antenna layer is produced separately from the other layers and connected to these afterwards.

In one implementation, an antenna device is produced on and/or at least partly in the antenna layer and subsequently the antenna layer is connected to the other layers.

The component layer is produced such that electronic components are integrated or embedded in the component layer.

In one implementation, at least one cooling body is applied and, in another implementation, connected to at least one electronic component in a thermally conducting manner.

The above implementations of the module arrangement can be realized by steps of corresponding implementations of the method so that a repetition of the explanation is omitted here.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
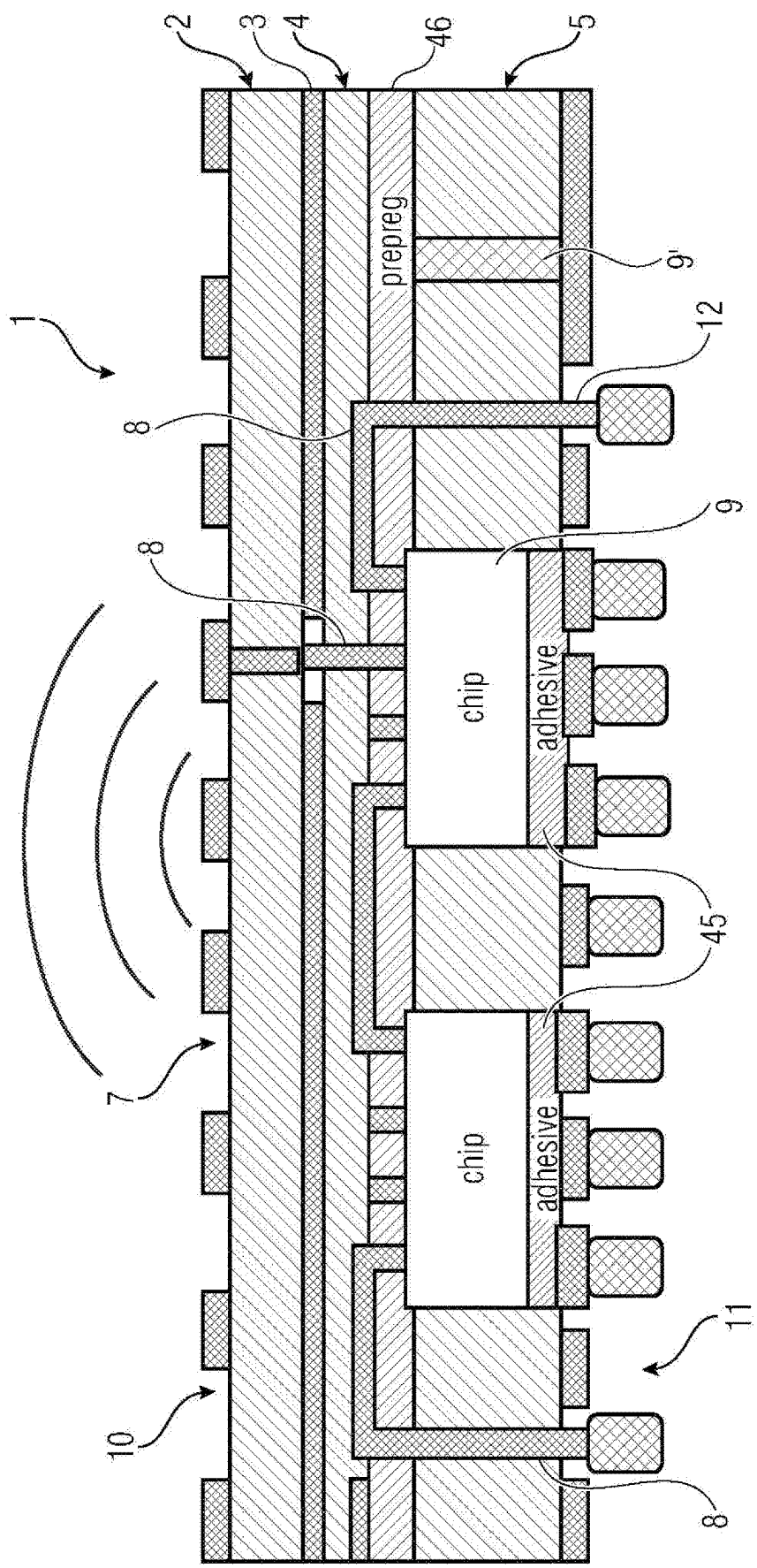
FIG. 1 shows a sectional view of a schematic illustration of a first implementation of the module arrangement.

The module arrangement 1 of FIG. 1 comprises a top side 10 and a bottom side 11. The top side 10 here serves for emitting electromagnetic signals. The bottom side 11 allows electrical contacting of the module arrangement 1.

Starting from the top side 10 towards the bottom side 11, the following layers are provided: antenna layer 2, shielding layer 3, distribution layer 4 and component layer 5.

The antenna layer 2—which in this example is a printed circuit board—comprises an antenna device 7 which is located on the top side 10 and serves for emitting the signals. The shielding layer 3 exemplarily comprises a metal layer which causes stray fields of the antenna device 7 to be shielded.

There are corresponding structures 8 in the distribution layer 4 for distributing signals or electrical energy to the antenna device 7 or between components 9, 9' of the component layer 5. Further connective structures 8 extend through the antenna layer 2 and the shielding layer 3, and through the component layer 5.

Electronic components 9, 9' which exemplarily serve for driving the antenna device 7 are located in the component layer 5. The electronic components 9, 9' are embedded (or integrated) in the component layer 5 which is a printed circuit board. Two chips 9 are shown, and a passive element 9' (like a capacitor, coil, resistor, diode, etc.). The component layer 5 and the distribution layer 4 here are fixed to each other by a prepreg layer 46.

The contacts of the chips 9 here are facing the distribution layer 4 and are guided to the contacts 12 via the connective structures 8. Further contacts of the chips 9 are connected to the respective other electronic components 9, 9'—that is to other chips or passive elements—within the distribution layer 4.

The chips 9 where an adhesive 45 is used for mounting on that side facing the bottom side 11 are connected to contacts 12 guided to the outside which are located on the bottom side 11 and allow contacting to the outside. Ball Grid Array solder balls are also provided on the bottom side 11.

The bottom side 11 here is particularly implemented such that the module arrangement 1 can be applied, and fixed, on another component or on a system, like the module, using the same.

In the following variations of the module arrangement 1, only the respective difference to the variation illustrated in FIG. 1 will be discussed in order to avoid repetitions.

Figure 2:
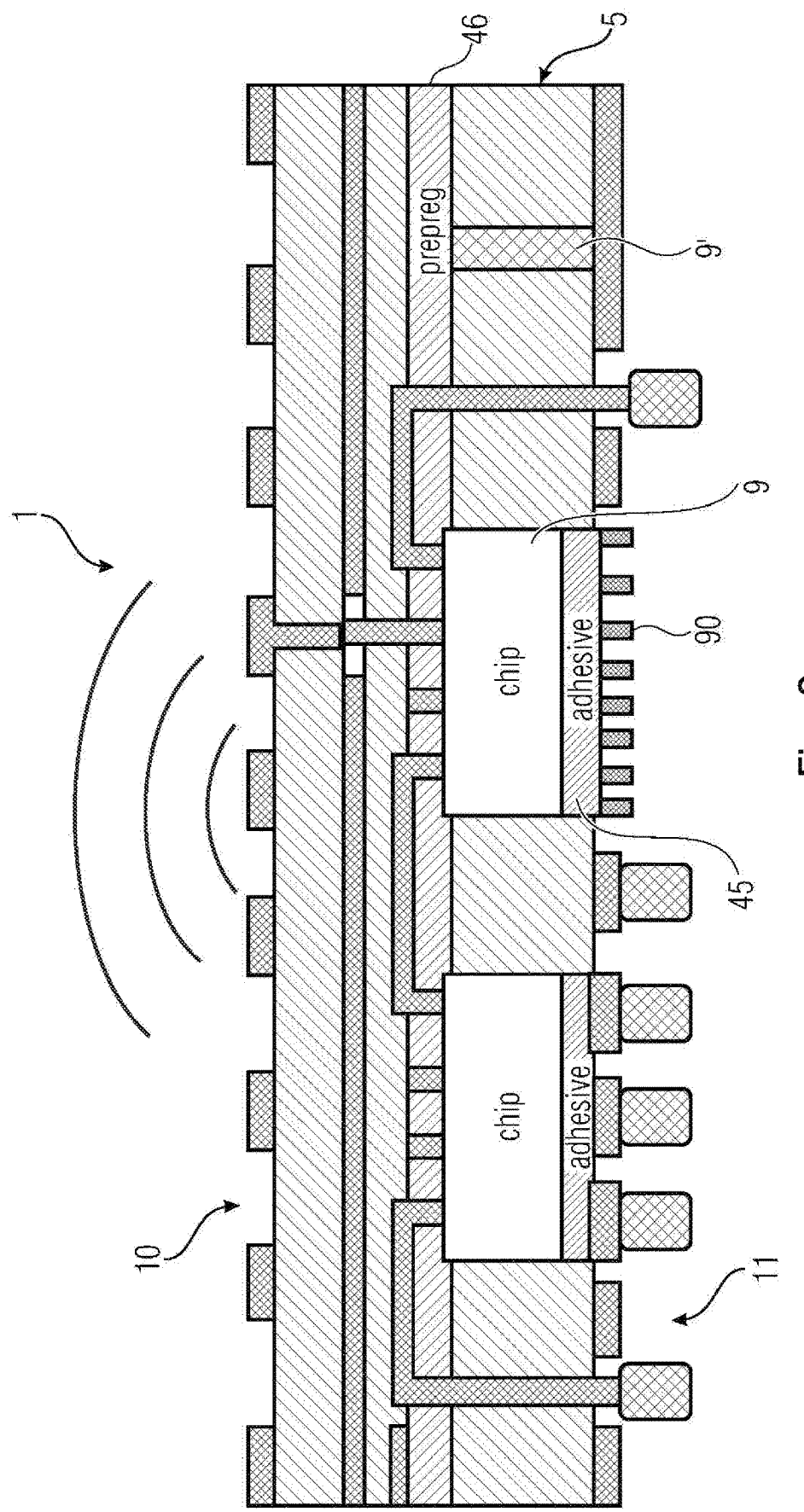
FIG. 2 shows a sectional view of a schematic illustration of a second implementation of the module arrangement.

The variation of the module arrangement 1 shown in FIG. 2 differs from the variation of FIG. 1 in that a chip 9 is contacted with a cooling body 90 for dissipating heat of the chip via an adhesive 45. The cooling body 90 here leads to the bottom side 11 of the module arrangement 1 so that, when installed, the heat can be transferred to following elements.

Figure 3:
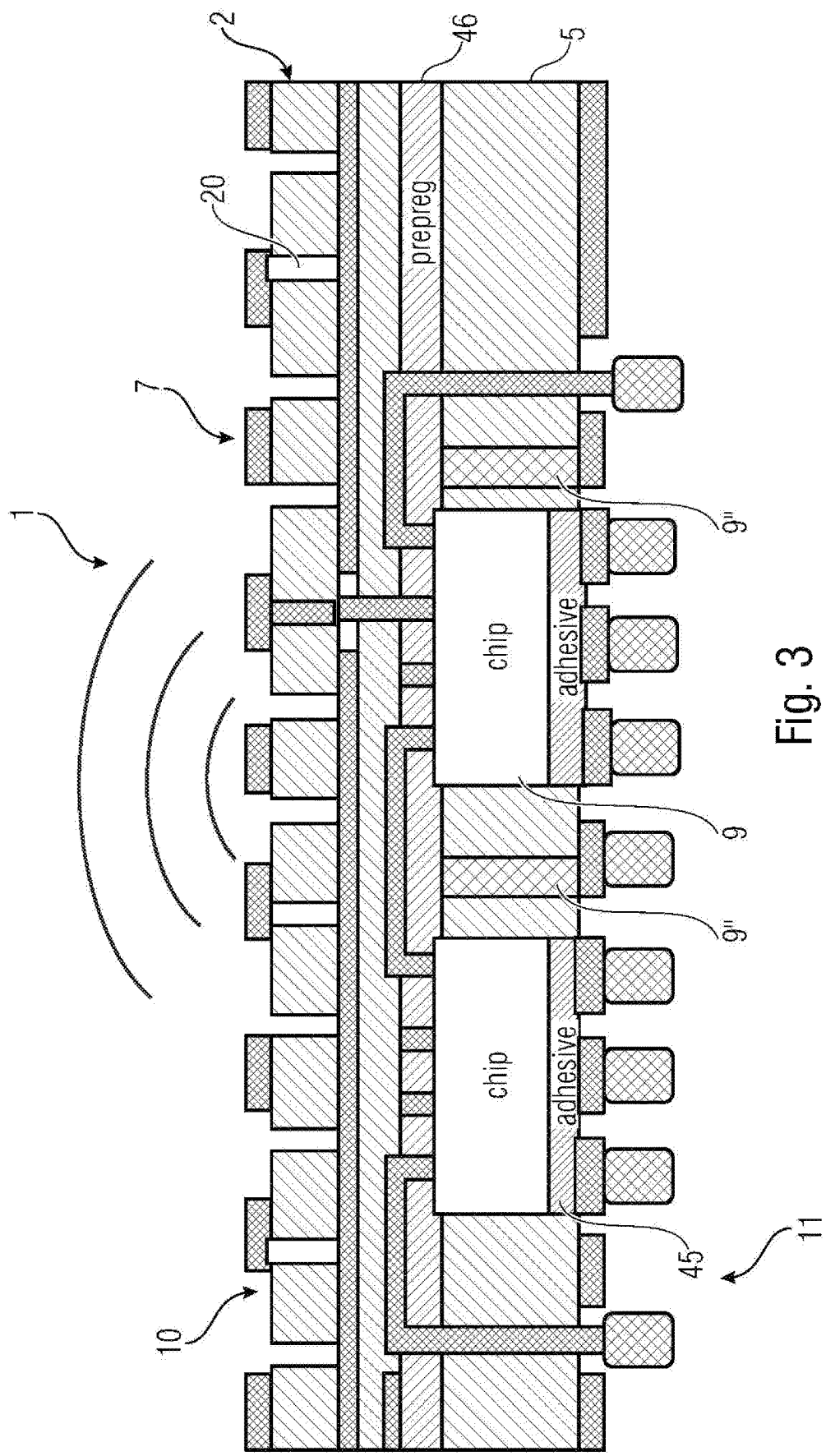
FIG. 3 shows a sectional view of a schematic illustration of a third implementation of the module arrangement.

The variation of FIG. 3 does not comprise separate elements 9' in the component layer 5 (compare FIGS. 1 and 2), but comprises electronic components 9" produced directly in the layer 5. These may exemplarily be capacitors arranged close to the chips 9 and providing for a stable energy supply thereof. In addition, holes 20 are introduced in the antenna layer 2. In particular, the holes 20 are implemented and arranged such that the result is a photonic bandgap structure for filtering surfaces waves. In addition, the permittivity of the antenna layer 2 is reduced by this.

Figure 4:
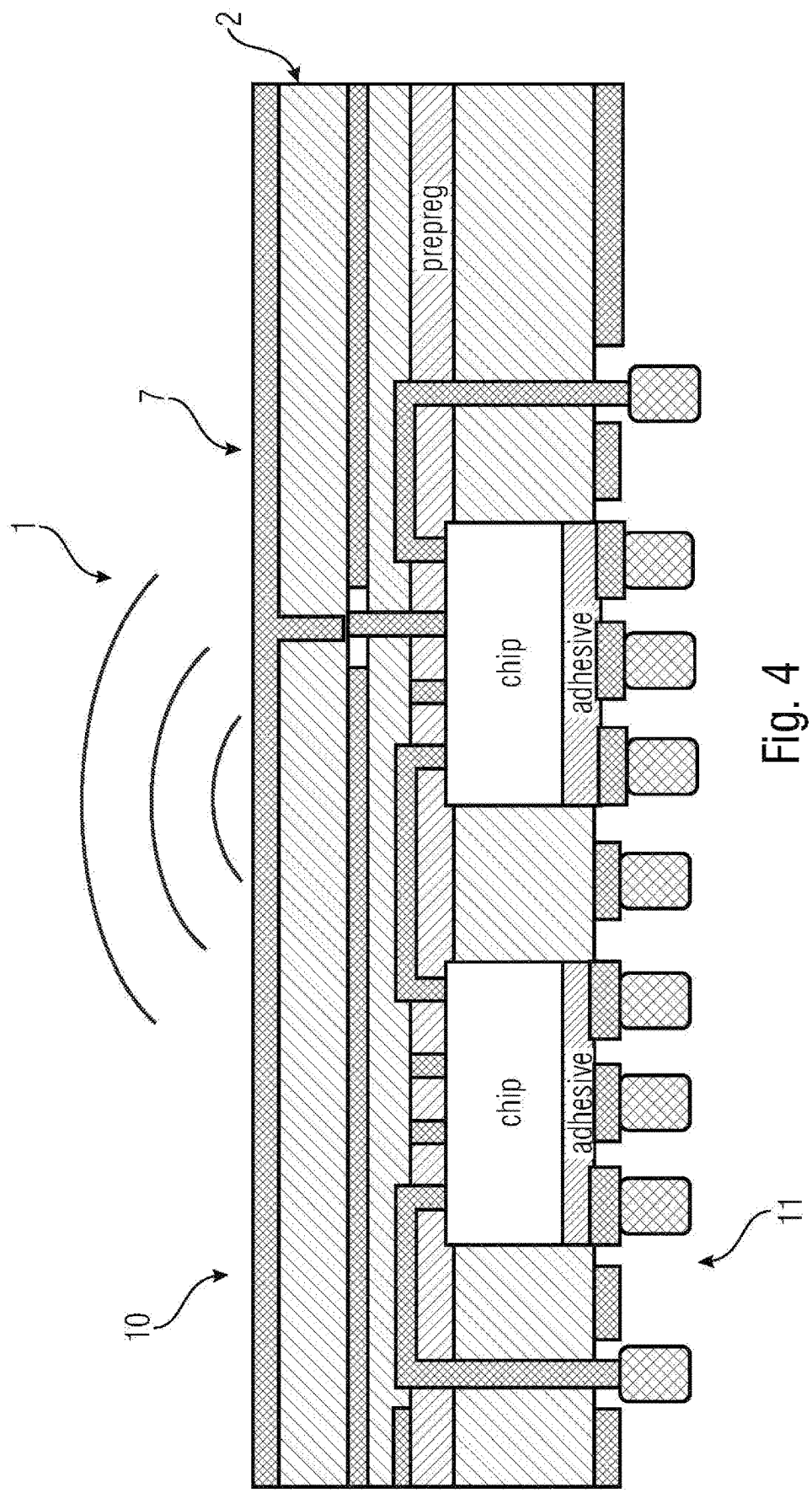
FIG. 4 shows a sectional view of a schematic illustration of a fourth implementation of the module arrangement.

While, in the variations of the FIGS. 1 to 3, the antenna devices 7 have been implemented such that the result was an interrupted surface on the top side 10, the antenna device 7 in the variation of FIG. 4 comprises a partly continuous uniform surface (like in the form of a metallization). Thus, the actual support material or a protective layer of the antenna layer 2 which may be present shows in the interrupted surface.

Figure 5:
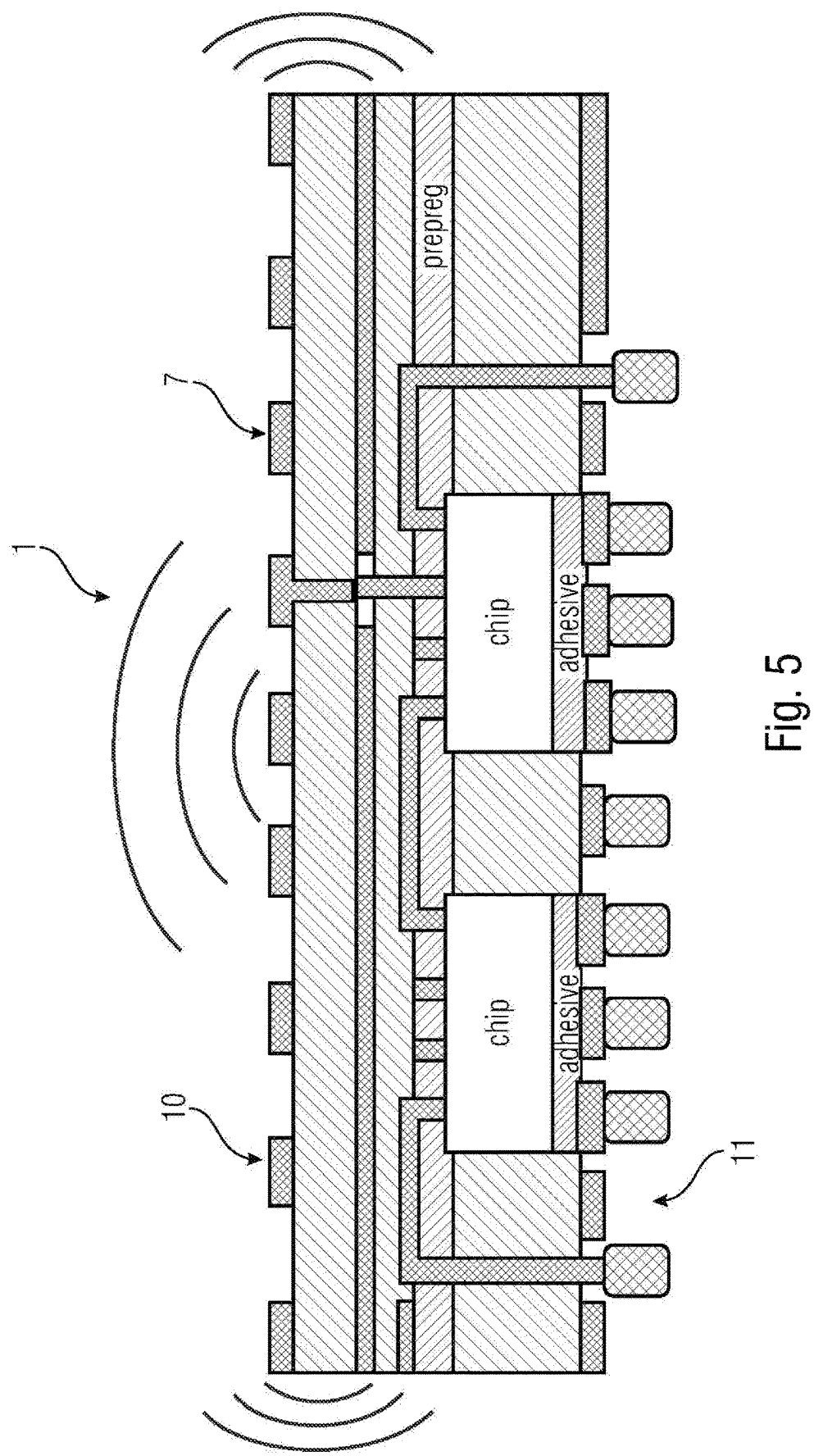
FIG. 5 shows a sectional view of a schematic illustration of a fifth implementation of the module arrangement.

FIG. 5 illustrates that the electromagnetic signals are not only emitted in the vertical direction, but that some antenna devices 7 allow emitting signals in an azimuthal direction. Here, signals are not only emitted vertically, but also to both sides of the antenna device 1.

Figure 6:
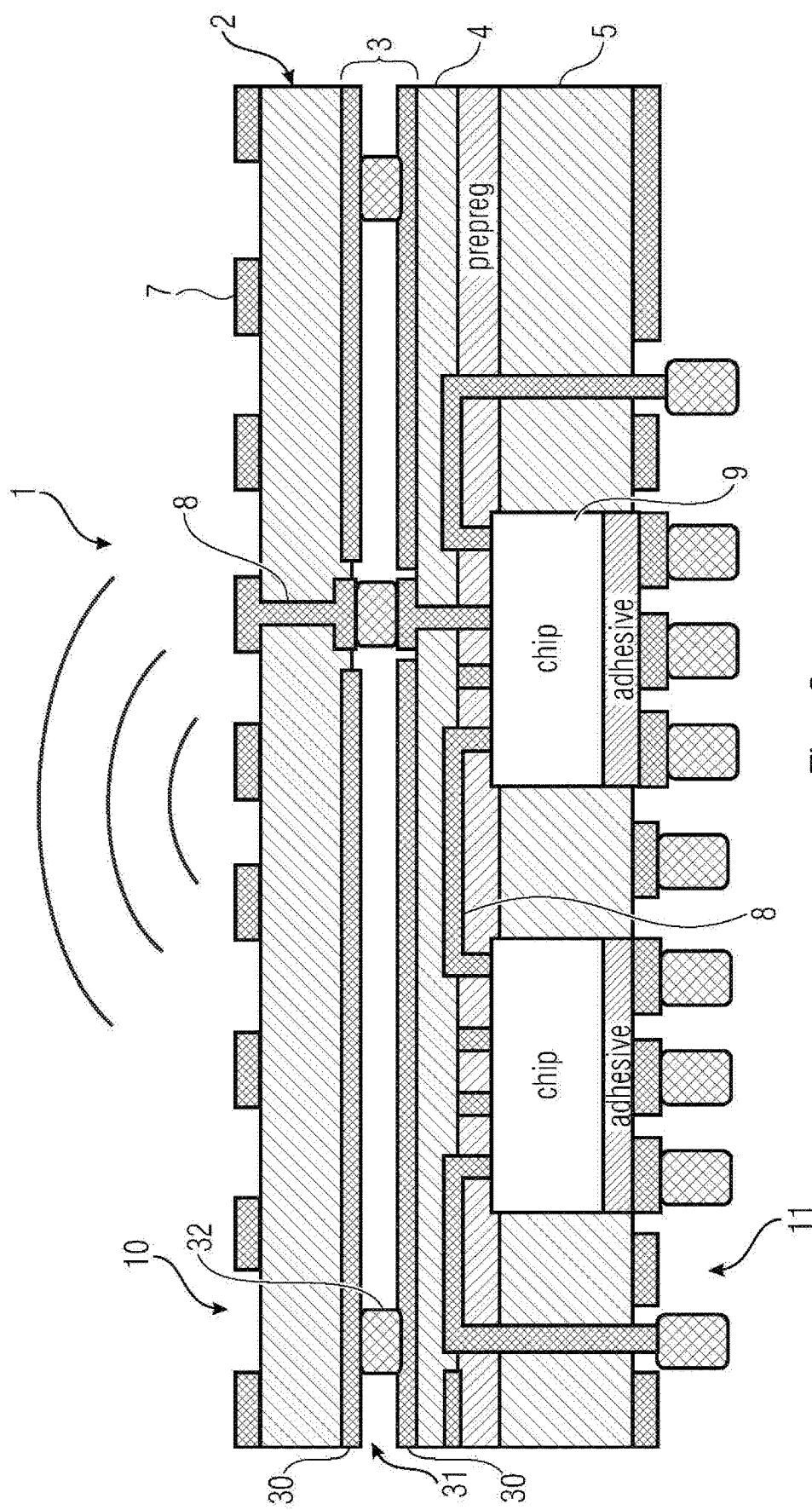
FIG. 6 shows a sectional view of a schematic illustration of a sixth implementation of the module arrangement.

In the variation of FIG. 6, the shielding layer 3 is made up of two sublayers 30 between which there is a recess 31 as an air gap. The two sublayers 30 are connected by several spacers 32 through which the connective structure 8 passes to the antenna device 7. Shielding can be optimized correspondingly using this implementation. Furthermore, the result is increased thermal decoupling.

In addition, the advantage here is that the antenna device 7 is manufactured and optimized using a suitable substrate in order to be connected subsequently to the remaining module arrangement via the spacers 32 as parts of a connective structure. In this implementation of FIG. 6, the antenna layer 2 is exemplarily made of a completely different material than the other layers. In one implementation, the antenna layer 2 is not a conventional printed circuit board material. Thus, the manufacturing method of the antenna layer 2 differs from the manufacturing methods applied for the other layers.

Figure 7:
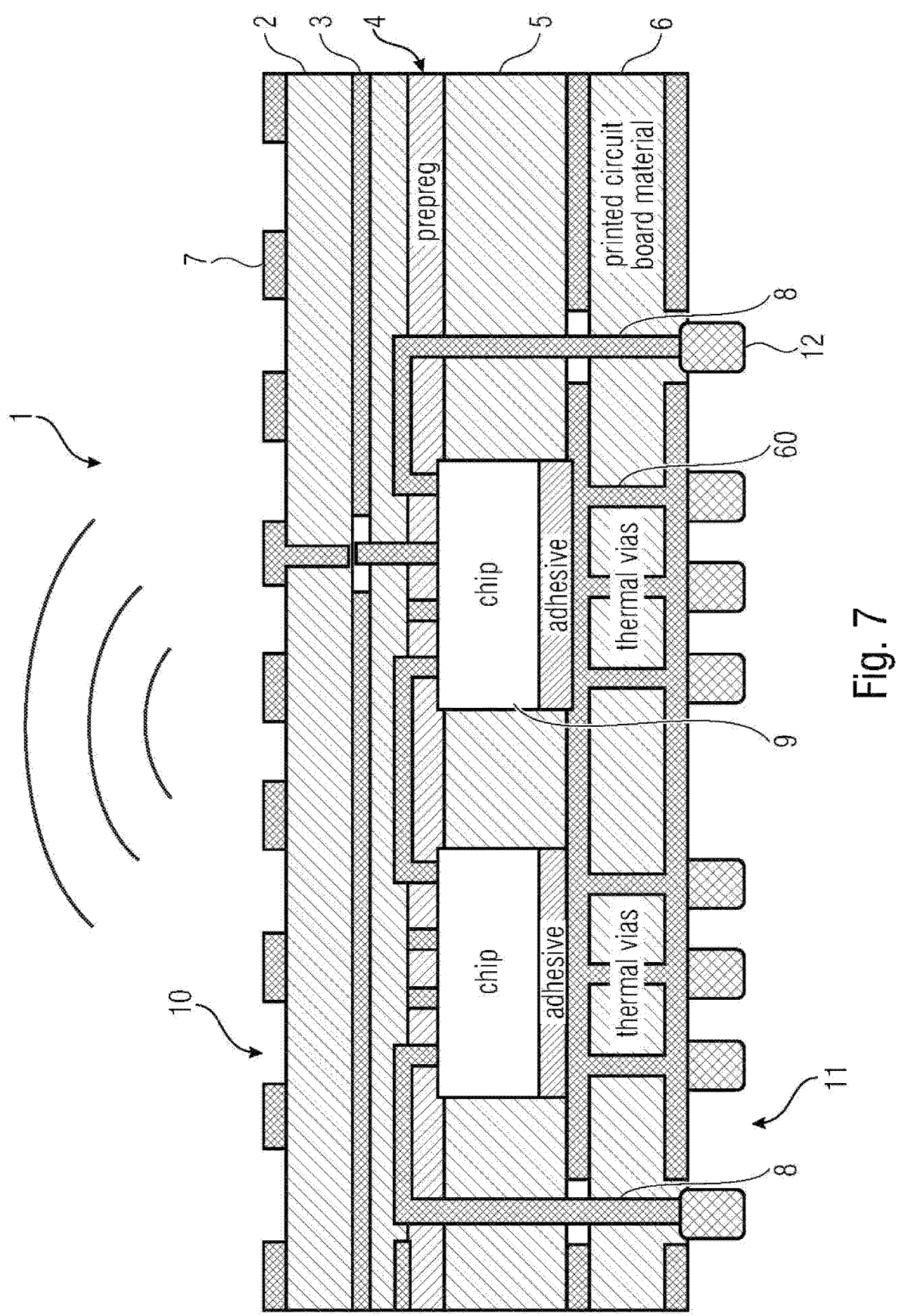
FIG. 7 shows a sectional view of a schematic illustration of a seventh implementation of the module arrangement.

FIG. 7 shows the case where a temperature control layer 6 is located below the component layer 5. The temperature control layer 6 here exemplarily is mainly made of a thermally conductive printed circuit board material through which thermal via holes 60 are guided. The via holes 60 are particularly located below the chips 9 of the component layer 5 for dissipating the heat thereof. The contactings of the chips 9 here are correspondingly guided through the temperature control layer 6 to the bottom side 11 of the module arrangement 1 and towards the contacts 12.

Figure 8:
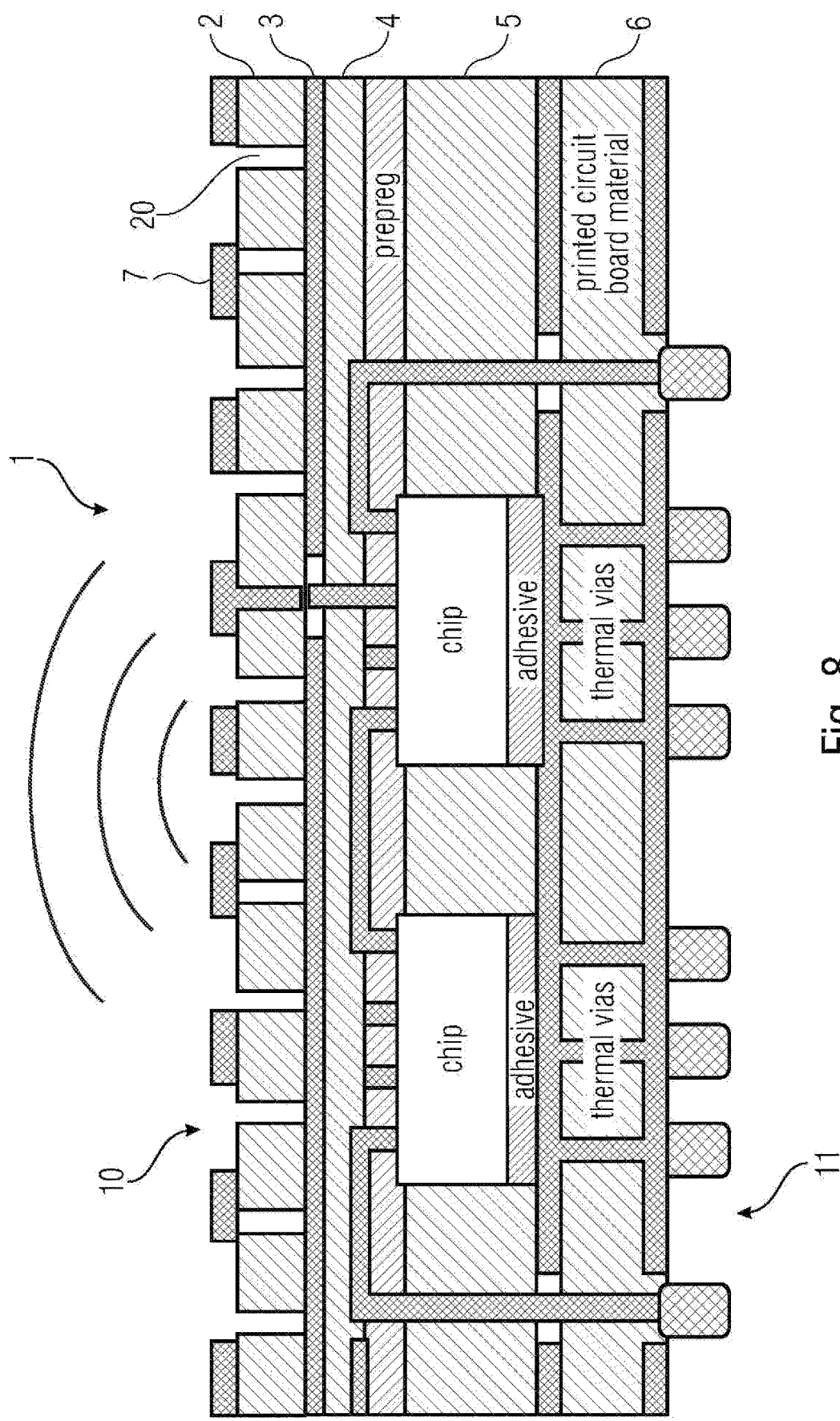
FIG. 8 shows a sectional view of a schematic illustration of an eighth implementation of the module arrangement.

FIG. 8 shows a modification of the variation of FIG. 7. Thus, the antenna layer 2 comprises holes 20 which are partly located below the regions of the surface 10 of the module arrangement 1, where there is no antenna device 7. The result here is a way for temperature control and, in particular, cooling.

Figure 9:
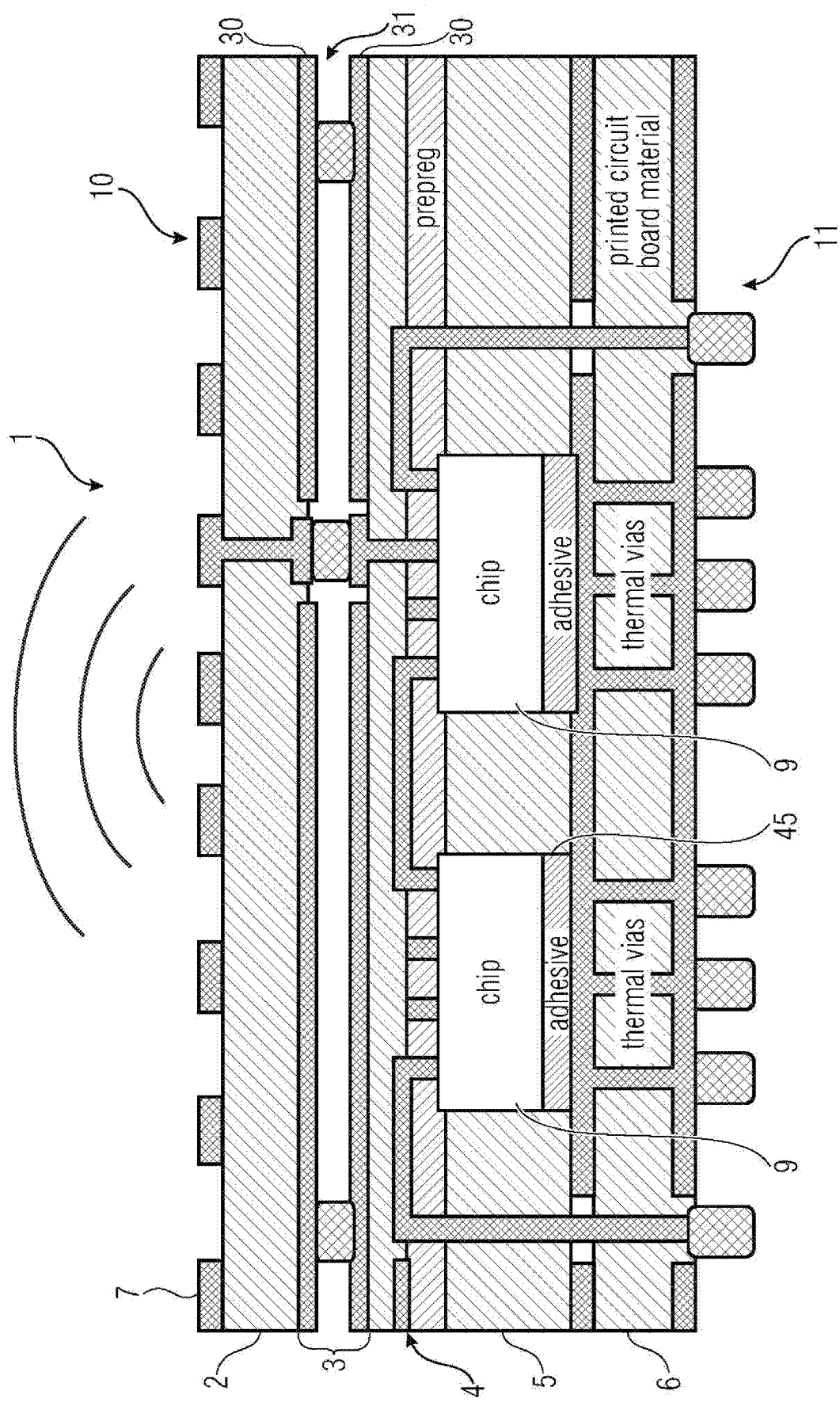
FIG. 9 shows a sectional view of a schematic illustration of a ninth implementation of the module arrangement.

The variation of FIG. 9 comprises a temperature control layer 6 and a shielding layer 3 consisting of several parts. The chips 9, as examples of the electronic components, are connected to the temperature control layer 6 using an adhesive 45. An adhesive 45 allows connecting the individual layers among one another in other implementations as well.

Figure 10:
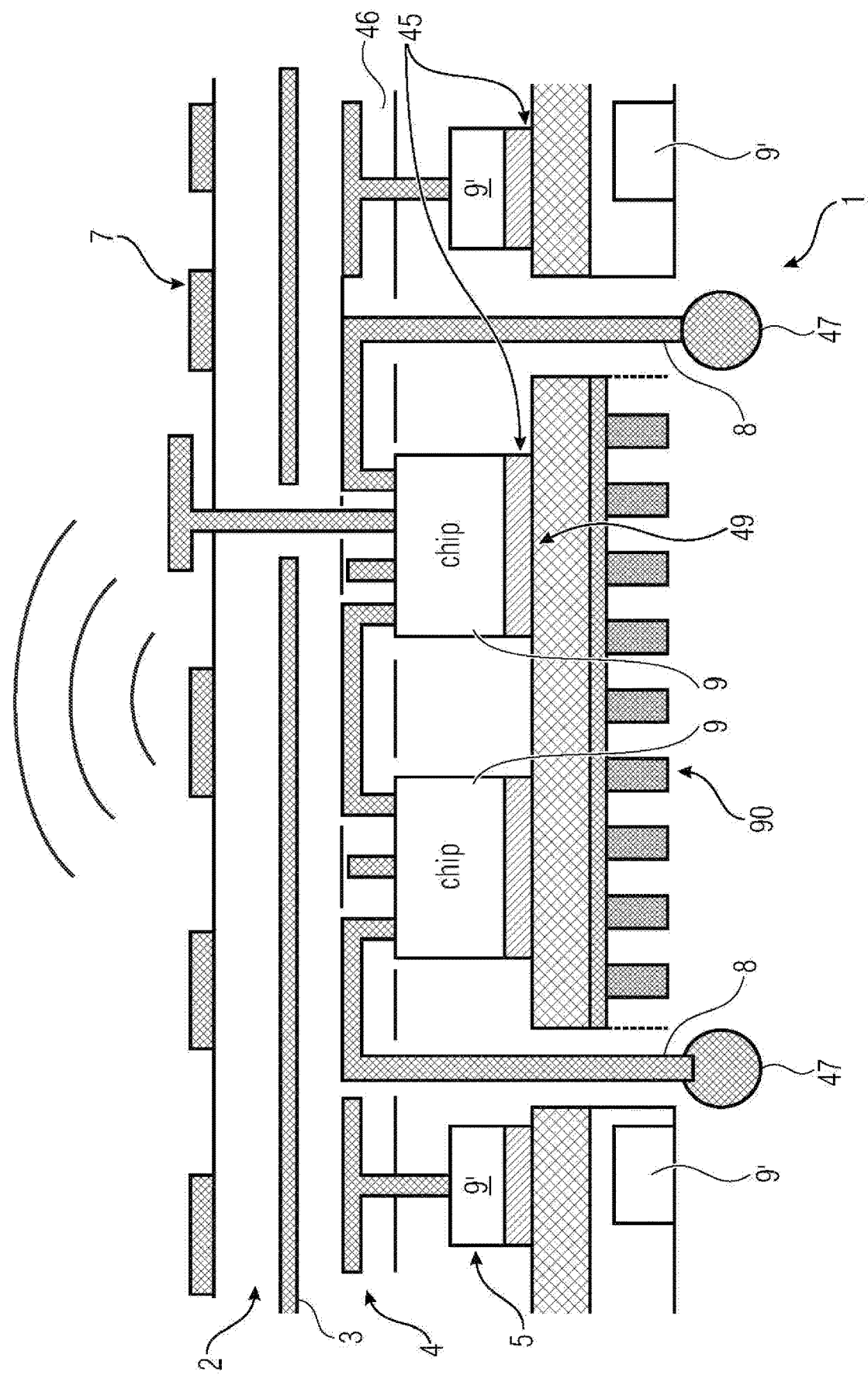
FIG. 10 shows a sectional view of a schematic illustration of a tenth implementation of the module arrangement.

The variation of the module arrangement 1 of FIG. 10 is made up of several layers or sheets.

Among these is the antenna layer 2 having the integrated antenna device 7 which in this case emits in an upward direction, and the shielding layer 3 through which an electrical connection is guided between the antenna device 7 and a chip as an electronic component 9. The distribution layer 4 is located below the shielding layer 3 and below it the component layer 5 which in turn comprises several layer or sheets. The distribution layer 4 and the component layer 5 are connected to each other via a prepreg layer 46.

Two chips 9 and further electronic components 9' are exemplarily embedded in the component layer 5. A metal core 49 on which the chips 9 and further electronic components 9' are applied by means of an adhesive 45 is located below the chips 9.

Further embedded components 9' are located below the metal core 49. Additionally, there is a free region where a cooling component in the form of a cooling body 90 is located. The cooling body 90 here is arranged below the two chips 9 so that, above all, the heat of these electronic components which generally are highly temperature-sensitive can be dissipated. This means that a so-called heat sink is formed.

For contacting, the two chips 9 are connected to solder balls 47 on the bottom side of the module arrangement 1 via connective structures 8.

Figure 11:
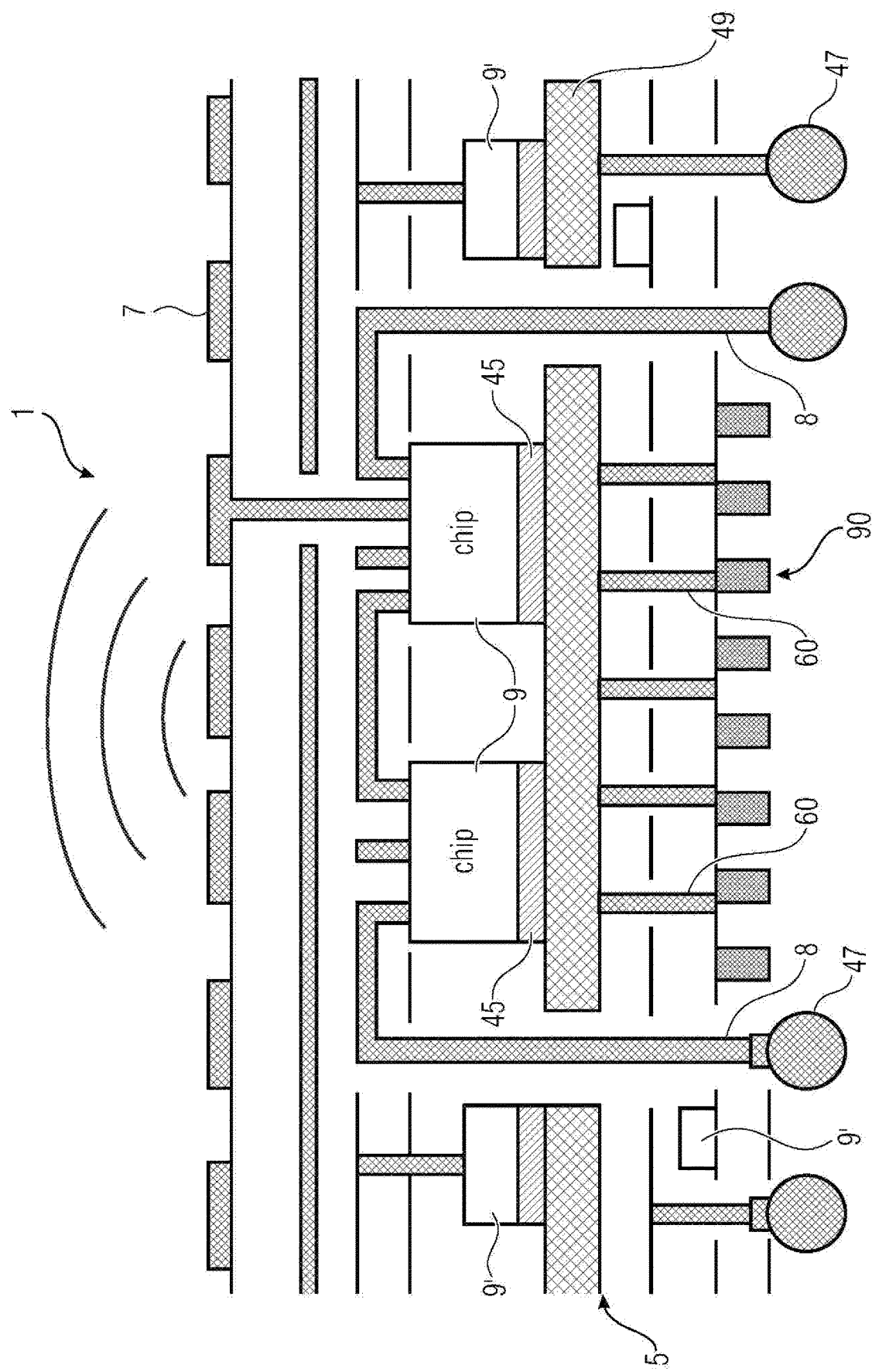
FIG. 11 shows a sectional view of a schematic illustration of an eleventh implementation of the module arrangement.

The implementation of FIG. 11 differs from the implementation of FIG. 10 in that several layers are located below the metal core 49, through which the connective structures 8 and via holes 60 (so-called thermal vias) are guided. Thus, the electronic contacting of the module arrangement 1 and the dissipation of thermal energy are located on the bottom side of the module arrangement 1, wherein the antenna device 7 forms the top side of the module arrangement 1. The heat sink 90 which is connected to the metal core 49 via the via holes 60 particularly serves for dissipating the heat of the chips 9. The chips 9 are mounted on the metal core 49 in the region of the cooling body 60 using an adhesive 45. The four solder balls 47 which are illustrated exemplarily comprise equal dimensions and are located at the same height.

Figure 12:
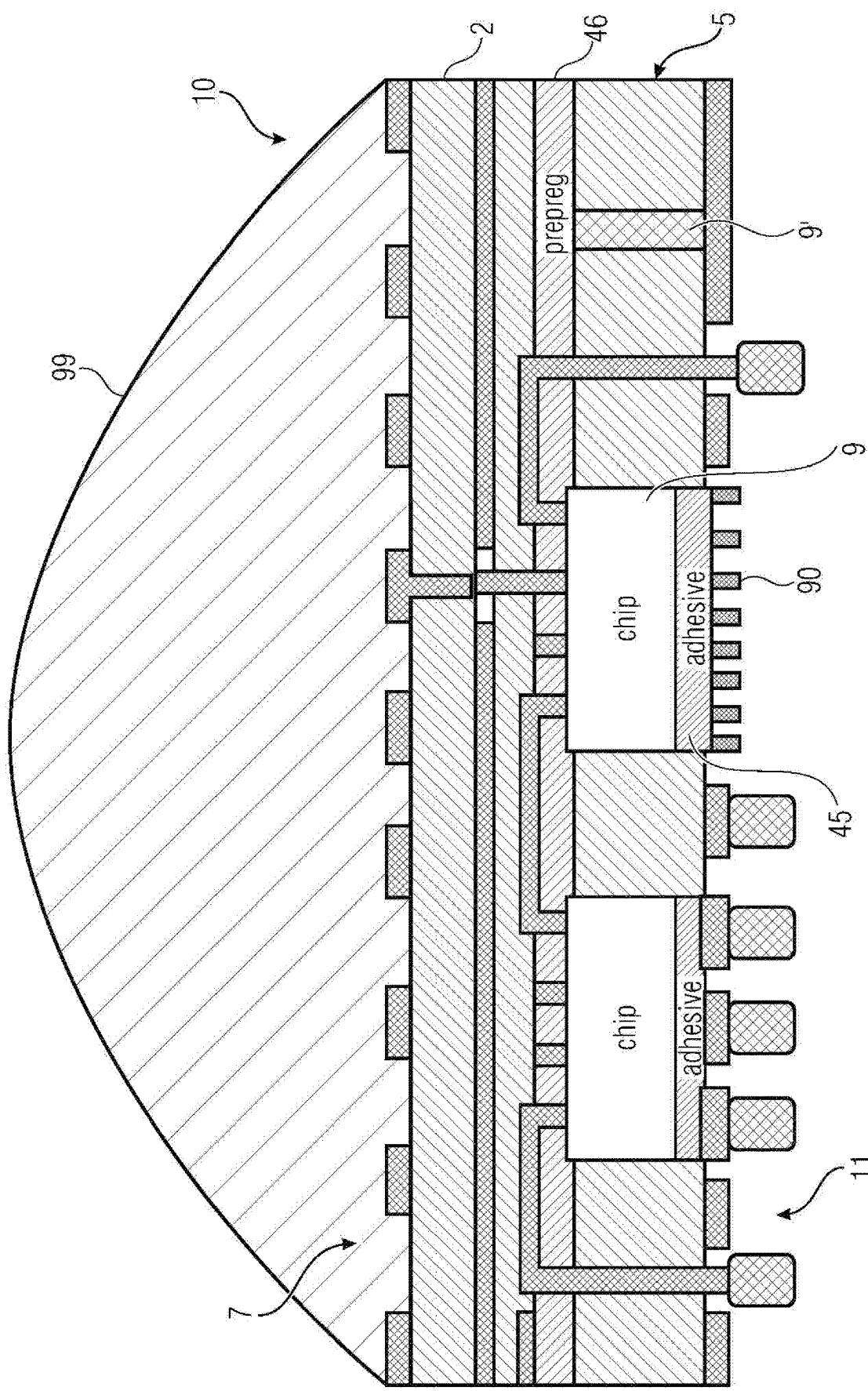
FIG. 12 shows a sectional view of a schematic illustration of a twelfth implementation of the module arrangement.

In the implementation of the module arrangement 1 of FIG. 12, a lens as a structure 99 for focusing the radiation of the antenna device 7 is located above the antenna device 7 and, thus, on the top side of the antenna layer 2.

Figure 13:
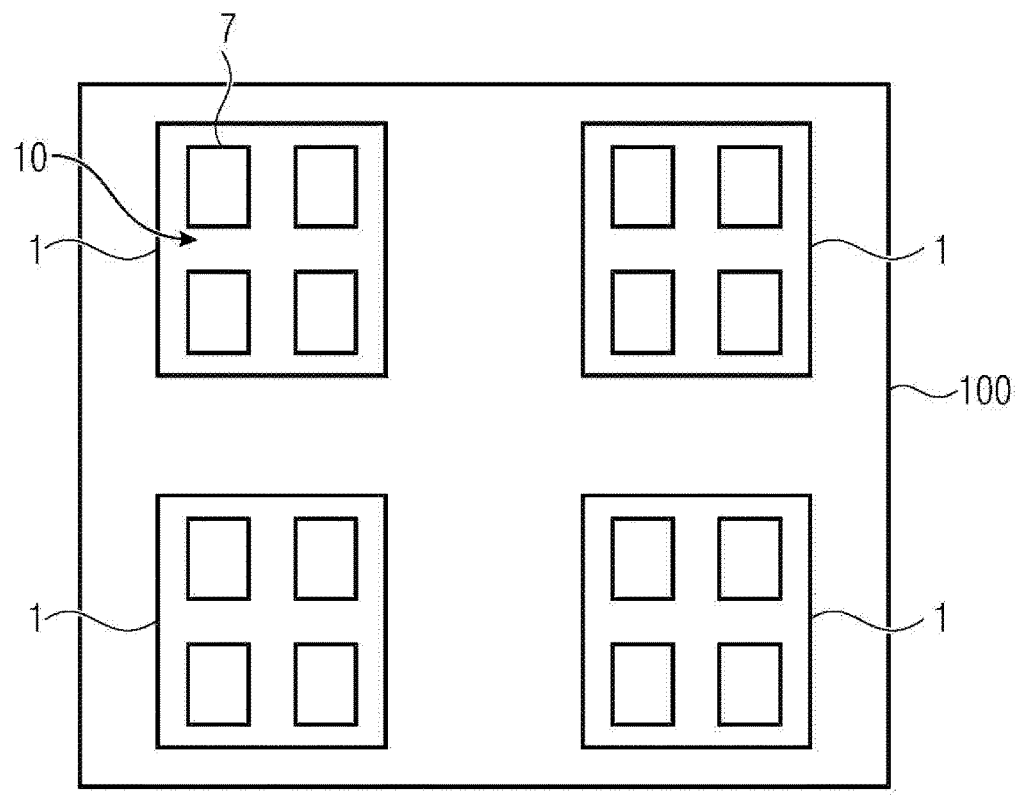
FIG. 13 shows a top view of a schematic illustration of a first implementation of the device comprising module arrangements.
Figure 14:
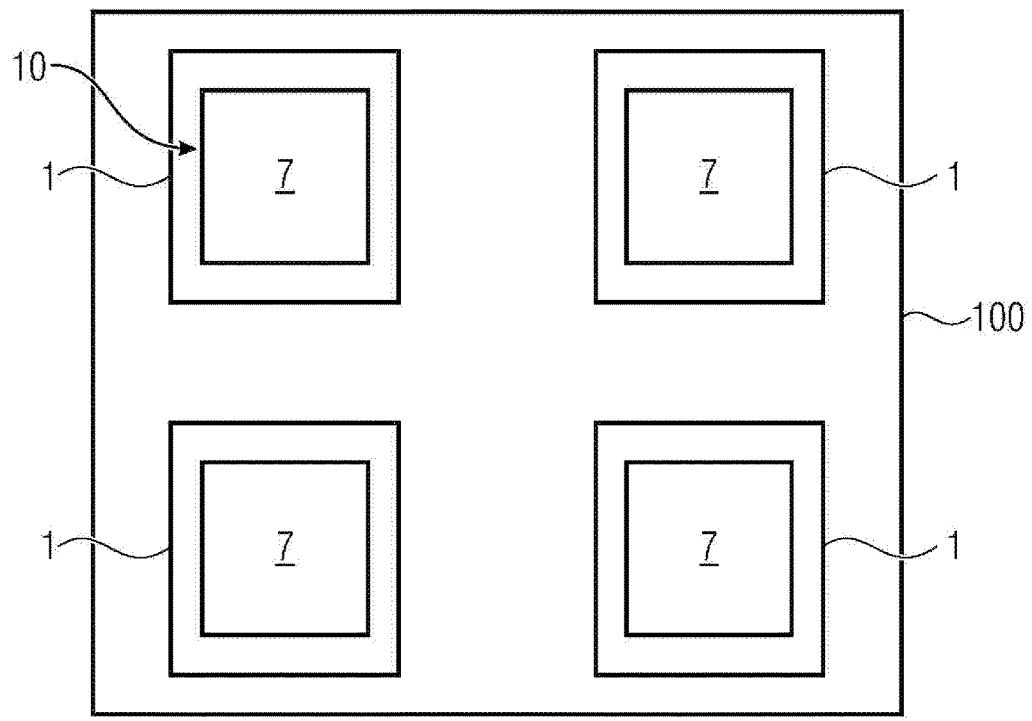
FIG. 14 shows a top view of a schematic illustration of a second implementation of the device comprising module arrangements.

FIGS. 13 and 14 each show a device 100 comprising several module arrangements 1. Four module arrangements 1 are illustrated as an example of an n*n matrix, wherein n here has a value of 2. The module arrangements 1 in one implementation are driven such that together they emit electromagnetic signals of a desired shape (so-called "beamforming"). The two variations of the device 100 differ relative to the module arrangements 1 in whether the antenna devices 7 on the top side 10 of the module arrangements 1 comprise an interrupted (FIG. 13) or a continuous (FIG. 14) surface.

Although some aspects have been described in the context of a device, it is clear that these aspects also represent a description of the corresponding manufacturing method such that a block or element of a device also corresponds to a respective method step or a feature of a method step. Analogously, aspects described in the context of or as a method step also represent a description of a corresponding block or item or feature of a corresponding device.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A module arrangement,
wherein the module arrangement comprises at least an antenna layer, a shielding layer, a distribution layer, a component layer, and a temperature control layer,
wherein the antenna layer supports an integrated antenna device,
wherein the shielding layer is implemented so as to be of a shielding effect relative to electromagnetic signals,
wherein the distribution layer comprises structures for distributing signals and/or electrical energy,
wherein the component layer supports embedded electronic components,
wherein a chip in the component layer, whose active side is facing the antenna, is directly connected to the antenna using a via,
wherein the temperature control layer, starting from a top side towards a bottom side of the module arrangement, follows after the component layer,
wherein a connective structure is guided through the temperature control layer and is in contact with a contact located on a bottom side of the temperature control layer, wherein the connective structure comprises an electrically conductive via which extends from the contact located on the bottom side of the temperature control layer, through the temperature control layer and to the distribution layer,
wherein at least one embedded electronic component is thermally connected to a cooling body.

2. The module arrangement in accordance with claim 1, wherein, starting from a top side towards a bottom side of the module arrangement, the following sequence is provided: the antenna layer, the shielding layer, the distribution layer and the component layer.

3. The module arrangement in accordance with claim 2, wherein at least one metal core is provided, and
wherein the metal core is located below the component layer.

4. The module arrangement in accordance with claim 1, wherein the contact is configured to electrically contact the module arrangement.

5. The module arrangement in accordance with claim 1, wherein at least one structure for focusing the radiation of the antenna device is provided advantageously above the antenna layer.

6. The module arrangement in accordance with claim 1, wherein at least one cooling component is provided.

7. The module arrangement in accordance with claim 1, wherein the at least one embedded electronic component is thermally connected to the cooling body via a metal core.

8. The module arrangement in accordance with claim 1, wherein the at least one embedded electronic component is thermally connected to the cooling body via at least one via hole.

9. The module arrangement in accordance with claim 1, wherein the at least one embedded electronic component is thermally connected to the cooling body via a metal core and via at least one via hole.

10. The module arrangement in accordance with claim 1, wherein only the component layer supports electronic components.

11. The module arrangement in accordance with claim 1, wherein the electronic components are embedded in the component layer.

12. The module arrangement in accordance with claim 1, wherein the shielding layer comprises at least two sublayers.

13. The module arrangement in accordance with claim 12, wherein a recess is located between the two sublayers.

14. The module arrangement in accordance with claim 1, wherein at least one electronic component is embedded in the module arrangement,
wherein the antenna device is integrated in the module arrangement, and
wherein at least one cooling component for removing thermal energy is provided.

15. A device comprising module arrangements,
wherein the module arrangements are implemented in accordance with claim 1.

16. The device in accordance with claim 15, wherein the module arrangements are arranged to form a matrix.

17. The module arrangement in accordance with claim 1, wherein holes are arranged in the antenna layer, and
wherein the holes are implemented and arranged such that the result is a photonic bandgap structure for filtering surface waves and/or such that the permittivity of the antenna layer is decreased.

18. The module arrangement in accordance with claim 1, wherein the temperature control layer is made of a thermally well-conducting material for dissipating or distributing heat, when produced by the electronic components.

19. The module arrangement in accordance with claim 1, wherein the thermal via holes are guided through the temperature control layer.

20. The module arrangement in accordance with claim 1, wherein the via holes are only located below the embedded electronic components for dissipating the heat thereof.

21. A method for manufacturing a module arrangement,
wherein an antenna layer comprising an integrated antenna device is produced,
wherein a shielding layer is produced,
wherein a distribution layer is produced,
wherein a component layer comprising embedded components is produced,
wherein at least the antenna layer, the shielding layer, the distribution layer and the component layer are connected to one another and/or are at least partly produced together,
wherein a chip in the component layer, whose active side is facing the antenna, is directly connected to the antenna using a via,
wherein a temperature control layer of the module arrangement is produced,
wherein the temperature control layer, starting from a top side towards a bottom side of the module arrangement, follows after the component layer,
wherein a connective structure is guided through the temperature control layer and is in contact with a contact located on a bottom side of the temperature control layer,
wherein at least one embedded electronic component is thermally connected to a cooling body, and
wherein the connective structure comprises an electrically conductive via which extends from the contact located on the bottom side of the temperature control layer, through the temperature control layer and to the distribution layer.

22. The method in accordance with claim 21,
wherein at least one of the antenna layer, the shielding layer, the distribution layer or the component layer is produced separately.

23. The method in accordance with claim 21,
wherein the antenna layer is produced separately from the shielding layer, the distribution layer and the component layer, and
wherein the antenna layer is connected to the shielding layer, the distribution layer, and the component layer.

24. The method in accordance with claim 21,
wherein at least one metal core is produced.

25. The method in accordance with claim 21,
wherein the cooling body is applied.

26. The method in accordance with claim 21,
wherein at least one structure for focusing the radiation of the antenna device is produced.

* * * * *